US008638421B2

United States Patent
Kadijk et al.

(10) Patent No.: US 8,638,421 B2
(45) Date of Patent: Jan. 28, 2014

(54) LITHOGRAPHIC APPARATUS AND METHOD OF CLEANING A LITHOGRAPHIC APPARATUS

(75) Inventors: Edwin Cornelis Kadijk, Eindhoven (NL); Jeroen Van Den Akker, Goirle (NL); David Lucien Anstotz, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 620 days.

(21) Appl. No.: 12/233,000

(22) Filed: Sep. 26, 2008

(65) Prior Publication Data

US 2009/0091716 A1    Apr. 9, 2009

Related U.S. Application Data

(60) Provisional application No. 60/960,385, filed on Sep. 27, 2007.

(51) Int. Cl.
*G03B 27/58* (2006.01)
*G03B 27/52* (2006.01)

(52) U.S. Cl.
USPC .............................................. 355/72; 355/30

(58) Field of Classification Search
USPC .................. 355/53, 30, 72; 510/170
See application file for complete search history.

(56) References Cited

U.S. PATENT DOCUMENTS

| | | | |
|---|---|---|---|
| 4,509,852 A | 4/1985 | Tabarelli et al. | |
| 6,496,257 B1 | 12/2002 | Taniguchi et al. | 356/239.2 |
| 7,050,146 B2 | 5/2006 | Duineveld et al. | |
| 7,091,502 B2 | 8/2006 | Gau et al. | 250/492.2 |
| 7,224,427 B2 | 5/2007 | Chang et al. | 355/30 |
| 7,224,434 B2 | 5/2007 | Tokita | 355/53 |
| 7,307,263 B2 | 12/2007 | Bakker et al. | 250/492.2 |
| 7,315,033 B1 | 1/2008 | Pawloski et al. | 250/492.2 |
| 7,315,346 B2 | 1/2008 | Van Beek et al. | |
| 7,385,670 B2 | 6/2008 | Compen et al. | 355/30 |
| 7,405,417 B2 | 7/2008 | Stevens et al. | 250/504 R |
| 7,462,850 B2 | 12/2008 | Banine et al. | 250/504 R |
| 2004/0160582 A1* | 8/2004 | Lof et al. | 355/30 |
| 2004/0207824 A1 | 10/2004 | Lof et al. | |
| 2005/0024609 A1 | 2/2005 | De Smit et al. | 355/18 |
| 2005/0175776 A1 | 8/2005 | Streefkerk et al. | 427/256 |
| 2005/0264774 A1 | 12/2005 | Mizutani et al. | 355/30 |

(Continued)

FOREIGN PATENT DOCUMENTS

| | | |
|---|---|---|
| CN | 1963673 | 5/2007 |
| EP | 1 420 298 A2 | 5/2004 |

(Continued)

OTHER PUBLICATIONS

Korean Office Action mailed Dec. 17, 2010 in related Korean patent application No. 10-2010-0089783.

(Continued)

*Primary Examiner* — Peter B Kim
*Assistant Examiner* — Deoram Persaud
(74) *Attorney, Agent, or Firm* — Pillsbury Winthrop Shaw Pittman LLP

(57) ABSTRACT

An immersion lithographic apparatus is described in which an inlet is provided to provide cleaning fluid to a space between an object, such as a substrate, positioned on a substrate table and the substrate table.

33 Claims, 4 Drawing Sheets

(56) References Cited

U.S. PATENT DOCUMENTS

| | | | |
|---|---|---|---|
| 2005/0274898 A1 | 12/2005 | Watanabe et al. | 250/372 |
| 2006/0023185 A1 | 2/2006 | Hazelton et al. | 355/53 |
| 2006/0050351 A1 | 3/2006 | Higashiki | 359/228 |
| 2006/0077367 A1* | 4/2006 | Kobayashi et al. | 355/53 |
| 2006/0081273 A1 | 4/2006 | McDermott et al. | |
| 2006/0103818 A1 | 5/2006 | Holmes et al. | 355/53 |
| 2006/0132731 A1 | 6/2006 | Jansen et al. | 355/30 |
| 2006/0232757 A1 | 10/2006 | Tani et al. | 355/53 |
| 2006/0250588 A1 | 11/2006 | Brandl | 355/30 |
| 2006/0256316 A1 | 11/2006 | Tanno et al. | 355/72 |
| 2006/0291855 A1* | 12/2006 | Shigemori et al. | 396/611 |
| 2007/0002296 A1 | 1/2007 | Chang et al. | 355/53 |
| 2007/0026345 A1 | 2/2007 | Subramanian et al. | 430/311 |
| 2007/0064215 A1 | 3/2007 | Dirksen et al. | 355/77 |
| 2007/0076197 A1 | 4/2007 | Koga | 356/237.3 |
| 2007/0085989 A1 | 4/2007 | Nagahashi et al. | 355/53 |
| 2007/0091287 A1 | 4/2007 | Chang et al. | 355/30 |
| 2007/0127001 A1 | 6/2007 | Van Der Hoeven | 355/53 |
| 2007/0146657 A1 | 6/2007 | Van Mierlo et al. | 355/30 |
| 2007/0146658 A1 | 6/2007 | Van Mierlo et al. | 355/30 |
| 2007/0159610 A1 | 7/2007 | Shiraishi | 355/53 |
| 2007/0172234 A1 | 7/2007 | Shigemori et al. | 396/611 |
| 2007/0182943 A1 | 8/2007 | Goodwin | |
| 2007/0206279 A1 | 9/2007 | Brueck et al. | 359/391 |
| 2007/0229786 A1 | 10/2007 | Kemper et al. | |
| 2007/0229789 A1 | 10/2007 | Kawamura | 355/53 |
| 2007/0247600 A1 | 10/2007 | Kobayashi et al. | 355/30 |
| 2007/0251543 A1 | 11/2007 | Singh | 134/1 |
| 2007/0253710 A1 | 11/2007 | Kaneyama et al. | 396/611 |
| 2007/0258072 A1 | 11/2007 | Nagasaka et al. | 355/53 |
| 2007/0274711 A1 | 11/2007 | Kaneyama et al. | 396/611 |
| 2007/0285631 A1 | 12/2007 | Stavenga et al. | 355/30 |
| 2008/0002162 A1 | 1/2008 | Jansen et al. | 355/30 |
| 2008/0049201 A1 | 2/2008 | Stavenga et al. | 355/30 |
| 2008/0202555 A1* | 8/2008 | Shibazaki | 134/6 |
| 2008/0218712 A1 | 9/2008 | Compen et al. | 355/30 |
| 2008/0273181 A1 | 11/2008 | De Jong et al. | 355/30 |
| 2008/0284990 A1 | 11/2008 | De Jong et al. | 355/30 |
| 2009/0025753 A1 | 1/2009 | De Jong et al. | 134/10 |
| 2009/0027635 A1 | 1/2009 | De Jong et al. | 355/30 |
| 2009/0027636 A1 | 1/2009 | Leenders et al. | 355/30 |
| 2010/0195068 A1* | 8/2010 | Shibazaki | 355/30 |

FOREIGN PATENT DOCUMENTS

| | | |
|---|---|---|
| EP | 1 420 300 A2 | 5/2004 |
| EP | 1 429 189 | 6/2004 |
| EP | 1 793 276 A2 | 6/2007 |
| JP | 2000-323396 | 11/2000 |
| JP | 2004-327484 | 11/2004 |
| JP | 2005-072404 | 3/2005 |
| JP | 2005-079222 | 3/2005 |
| JP | 2005-277363 | 10/2005 |
| JP | 2006-032750 | 2/2006 |
| JP | 2006-134999 | 5/2006 |
| JP | 2006-310706 | 11/2006 |
| JP | 2007-029973 | 2/2007 |
| JP | 2007-072118 A | 3/2007 |
| JP | 2007-088328 | 4/2007 |
| JP | 2007-123882 | 5/2007 |
| JP | 2007-142217 | 6/2007 |
| JP | 2007-150102 | 6/2007 |
| JP | 2007-227543 | 9/2007 |
| JP | 2007-227580 | 9/2007 |
| WO | WO 99/49504 A1 | 9/1999 |
| WO | WO 2005/122218 | 12/2005 |
| WO | WO 2006/041086 | 4/2006 |
| WO | WO 2006/062065 | 6/2006 |
| WO | WO 2006/122578 | 11/2006 |
| WO | WO 2007/006447 | 1/2007 |
| WO | WO 2007/135990 | 11/2007 |
| WO | WO 2007/136089 | 11/2007 |
| WO | WO 2008/001871 | 1/2008 |
| WO | 2008/026593 | 3/2008 |

OTHER PUBLICATIONS

Japanese Office Action mailed Feb. 18, 2011 in corresponding Japanese Patent Application No. 2008-240097.
Taiwan Office Action dated Dec. 15, 2011 in corresponding Taiwan Patent Application No. 097137396.
Chinese Office Action dated Feb. 22, 2012 in corresponding Chinese Patent Application No. 201010283687.6.
U.S. Appl. No. 12/237,557, filed Sep. 25, 2008, Streefkerk et al.
U.S. Appl. No. 12/289,621, filed Oct. 30, 2008, De Jong et al.
U.S. Appl. No. 12/314,611, filed Dec. 12, 2008, De Jong et al.
U.S. Appl. No. 12/318,037, filed Dec. 19, 2008, De Graaf et al.
U.S. Appl. No. 12/358,000, filed Jan. 22, 2009, De Jong.
U.S. Appl. No. 11/806,662, filed Jun. 1, 2007, Frederik Eduard De Jong et al.

* cited by examiner

LITHOGRAPHIC APPARATUS AND METHOD OF CLEANING A LITHOGRAPHIC APPARATUS

This application claims priority and benefit under 35 U.S.C. §119(e) to U.S. Provisional Patent Application No. 60/960,385, filed Sep. 27, 2007, the foregoing application incorporated herein in its entirety by reference.

FIELD

The present invention relates to a lithographic apparatus and a method for cleaning such an apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The liquid may be distilled water, although an other liquid could be used. The description herein references a liquid. However, another fluid may be suitable, particularly a wetting fluid, incompressible fluid and/or a fluid with a higher refractive index than air, desirably a higher refractive index than water. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application Publication No. 1420300 and United States Patent Application Publication No. 2004-0136494, each of which is hereby incorporated in its entirety by reference, the idea of a twin or dual stage immersion lithography apparatus is disclosed. Such an apparatus is provided with two tables for supporting the substrate. Leveling measurements are carried out with a table at a first position, without immersion liquid. Exposure is carried out with a table at a second position, where immersion liquid is present. Alternatively, the apparatus may have only one table movable between exposure and measurement positions.

Contamination of a lithographic apparatus can be a problem. Pieces of topcoat, resist, residual particles on top of the substrate or the substrate table top surface, etc. may find their way into, for example, immersion liquid of an immersion lithographic apparatus. If such particles are in the immersion liquid between the projection system and the substrate, defects may be imaged onto the substrate, and damage may be caused to components of the immersion lithographic apparatus.

SUMMARY

It is desirable, for example, to take measures to reduce contamination of immersion liquid and thereby help to reduce image defects and prolong the life expectancy of components of the immersion lithographic apparatus.

According to an aspect of the invention, there is provided a lithographic apparatus comprising: a substrate table constructed to hold a substrate; a recess in the substrate table configured to receive an object; and a cleaning fluid supply device configured to supply cleaning fluid to at least an outer area of the recess.

According to an aspect of the invention, there is provided an immersion lithographic apparatus comprising: a substrate table constructed to hold a substrate; a drain in the substrate table configured to receive an immersion fluid which leaks, in use, into a gap between an edge of the substrate table and an object on the substrate table; and an inlet adjacent an end of an elongate member configured to supply cleaning fluid to (i) the gap, or (ii) an inlet to the drain, or (iii) the drain, or (iv) any combination selected from (i)-(iii).

According to an aspect of the invention, there is provided a method of cleaning at least a part of a recess in a substrate table configured to receive an object, the method comprising providing a cleaning fluid to at least an outer area of the recess and extracting the cleaning fluid from the recess.

According to an aspect of the invention, there is provided a lithographic projection apparatus comprising: a projection system arranged to project a pattern towards a substrate table; a liquid supply system arranged to supply a cleaning fluid to a gap defined between an edge of the substrate table and a substrate when present; and an inlet configured to remove excess fluid, wherein in use the inlet is located in the gap and is connected to an under pressure source so as to remove liquid from the gap.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
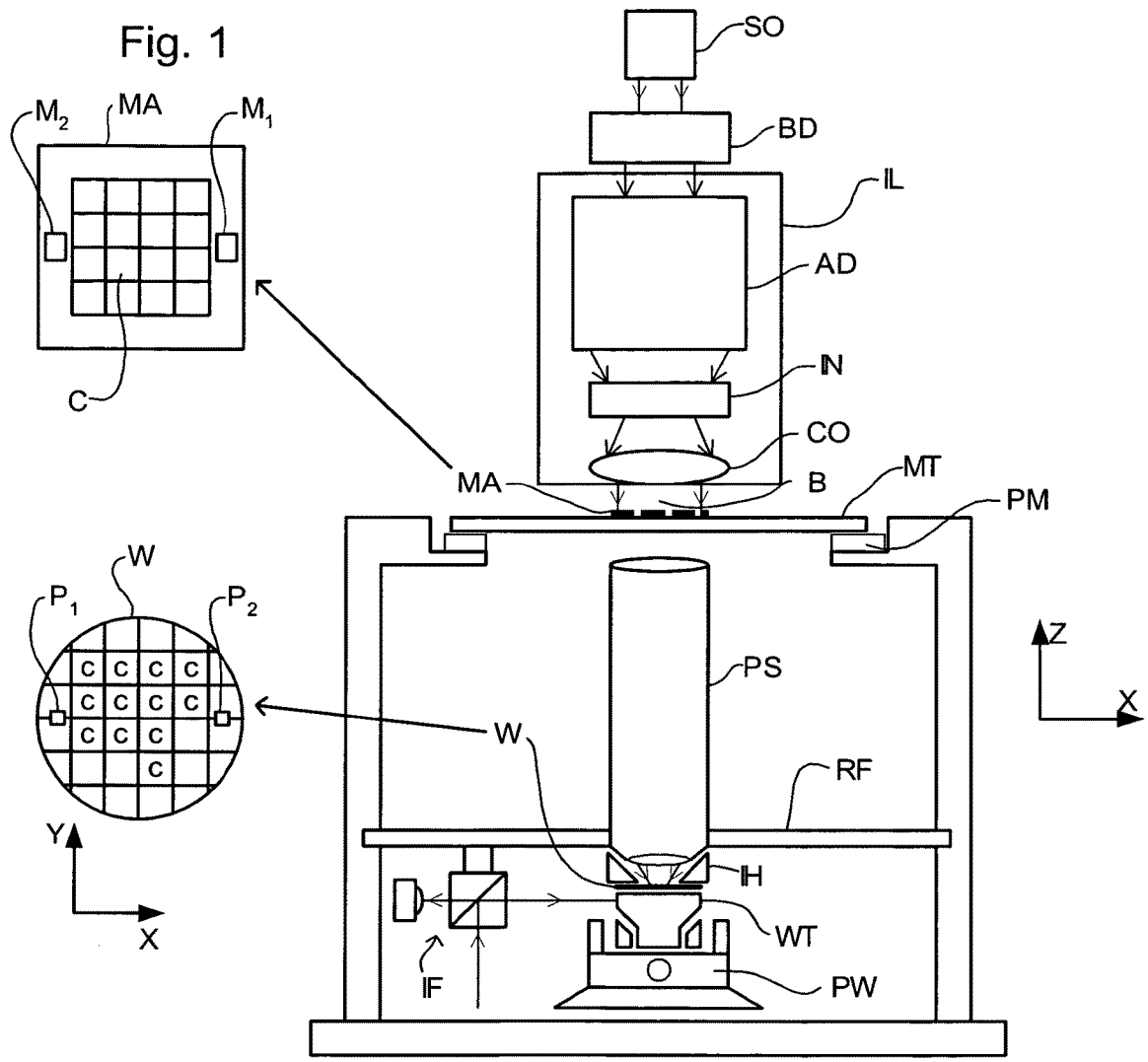
FIG. 1 depicts a lithographic apparatus according to an embodiment of the invention.
Figure 2:
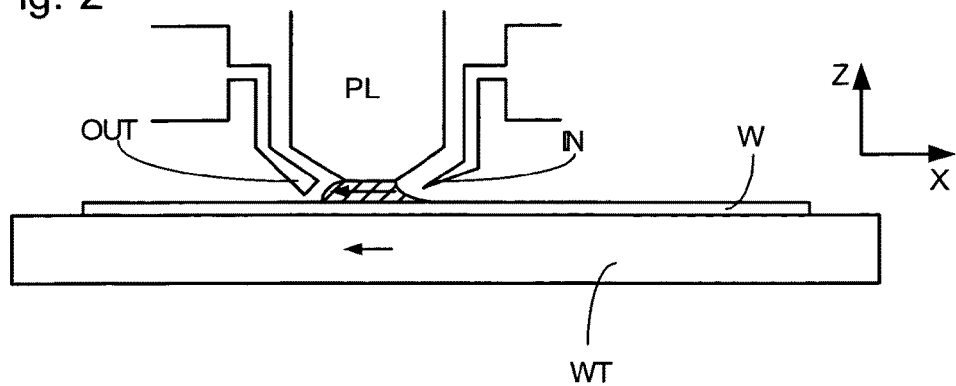
FIGS. 2 and 3 depict a liquid supply system for use in a lithographic projection apparatus.
Figure 3:
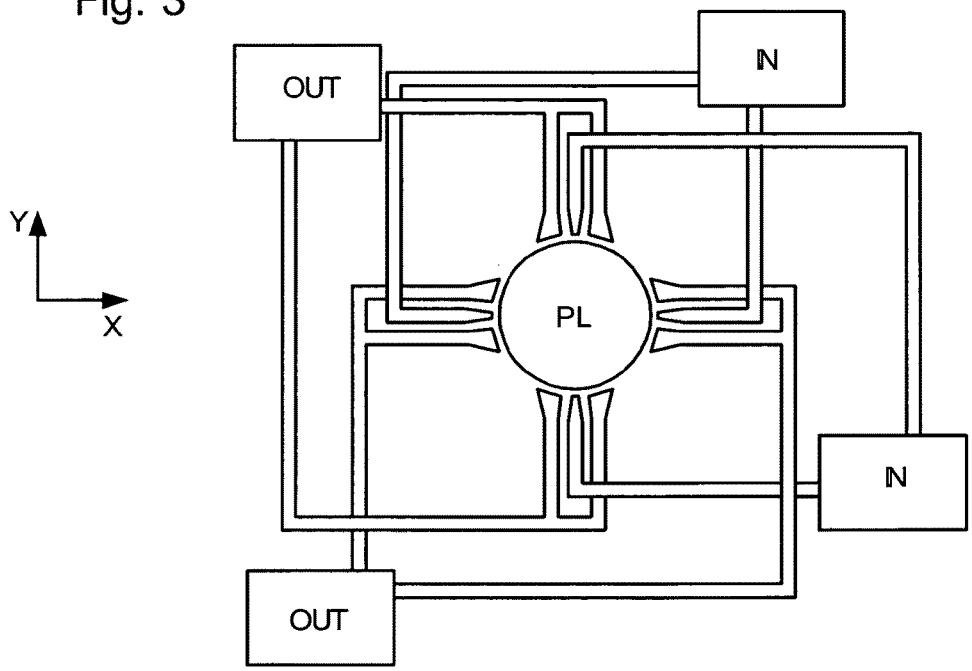
Figure 4:
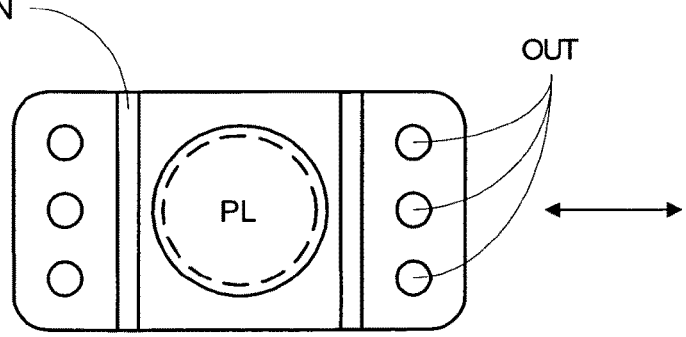
FIG. 4 depicts a further liquid supply system for use in a lithographic projection apparatus.
Figure 4:
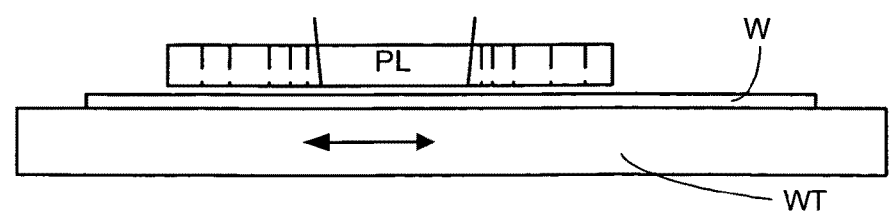

FIG. 1 schematically depicts a lithographic apparatus. The apparatus comprises:
an illumination system (illuminator) EL configured to condition a radiation beam B (e.g. UV radiation or DUV radiation);
a support structure (e.g. a mask table) MT constructed to support a patterning device (e.g. a mask) MA and connected to a first positioner PM configured to accurately position the patterning device in accordance with certain parameters;
a substrate table (e.g. a wafer table) WT constructed to hold a substrate (e.g. a resist-coated wafer) W and connected to a second positioner PW configured to accurately position the substrate in accordance with certain parameters; and
a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the patterning device support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the patterning device support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support structure MT and the substrate table WT are scanned synchronously while a pattern imparted to the radiation beam is projected onto a target portion C (i.e. a single dynamic exposure). The velocity and direction of the substrate table WT relative to the patterning device support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Although one or more embodiments of the present invention can be used with any type of liquid supply system, the design discussed herein may be optimized for use with any type of localized area liquid supply system. In this type of liquid supply system, liquid is only provided to a small area of the total top surface of a substrate at any one time. It is illustrative briefly to describe the operation of an example localized area liquid supply system.

Figure 5:
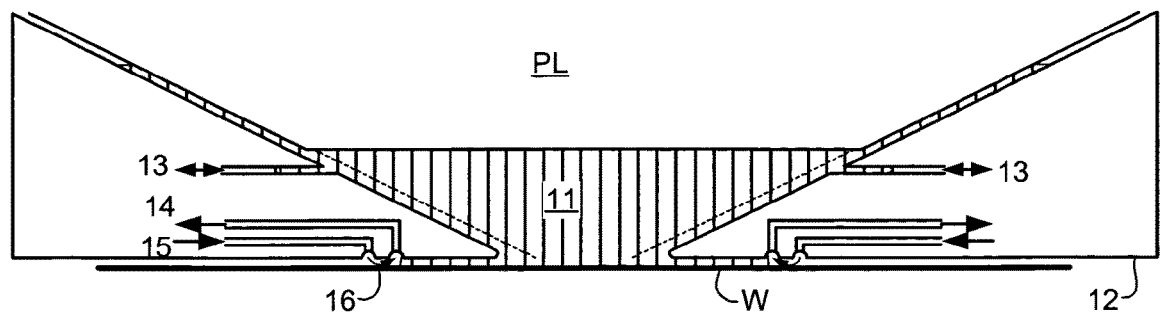
FIG. 5 depicts a localized area liquid supply system.

Referring to FIG. 5, the localized area liquid supply system comprises a liquid supply system with a liquid confinement structure which extends along at least a part of a boundary of the space between the final element of the projection system and the substrate table. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains immersion liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be continuous or discontinuous annular grooves which surround the space 11 and the flow of gas 16 is effective to contain the liquid in the space 11. Such a system is disclosed in United States patent application publication no. US 2004-0207824.

Other solutions are possible and one or more embodiments of the present invention are equally applicable to those. For example, in place of the gas seal 16 it is possible to have a single phase extractor which only extracts liquid or gas, or a dual phase extractor to extract a mixture of gas and liquid. Radially outwardly of such a single phase extractor could be one or more features to produce a gas flow to help contain the liquid in the space. One such type of feature might be a so-called gas knife in which a thin high pressure jet of gas is directed downwards onto the substrate W. During scanning motion of the substrate under the projection system and the liquid supply system, hydrostatic and hydrodynamic forces may be generated which result in pressures on the liquid downwards towards the substrate.

With a localized area liquid supply system, the substrate W is moved under the projection system PL and the liquid supply system. When an edge of the substrate W is to be imaged, or when a sensor on the substrate table is to be imaged, or the substrate table is to be moved such that a closing plate (sometimes called a dummy substrate) can be positioned under the liquid supply system to enable substrate swap to take place, an edge of the substrate W will pass under the space 11. In such an instance liquid may leak into the gap between the substrate W and substrate table WT. This liquid may be forced in under hydrostatic or hydrodynamic pressure or the force of a gas knife or other gas or liquid flow creating device.

Although one or more embodiments of the invention will be described below in relation to providing a drain around the edge of a substrate W, one or more embodiments are equally applicable to one or more other objects placed on the substrate table. These objects include, but are not limited to, a closing plate used to maintain liquid in the liquid supply system by being attached to the bottom of the liquid supply system during, for example, substrate swap, and/or one or more sensors. Thus, any reference below to the substrate W should be considered to be synonymous with any other object, such as a sensor or closing plate.

Figure 6:
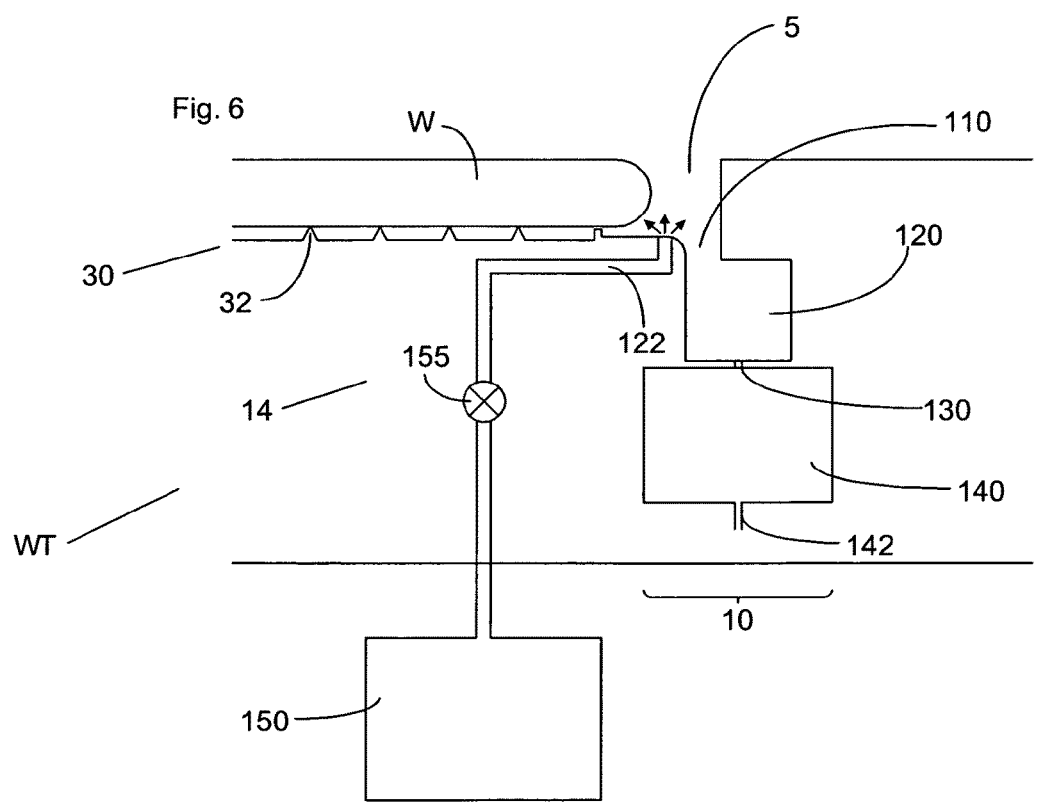
FIG. 6 illustrates, in cross-section, a substrate table according to an embodiment of the invention.

FIG. 6 illustrates an embodiment of the present invention. FIG. 6 is a cross-section through a substrate table WT and a substrate W. A gap 5 exists between an edge of the substrate W and an edge of the substrate table WT. The gap 5 is an outer area or edge of a recess in which the substrate is placed during imaging. In an immersion lithography apparatus, when the edge of the substrate W is being imaged or at other times such as when the substrate W first moves under the projection system PS (as described above), a gap 5 between the edge of the substrate W and the edge of the substrate table WT will pass under, for example, the space 11 filled with liquid by the liquid supply system 12. This can result in liquid from the space 11 entering the gap.

In order to deal with the liquid entering that gap at least one drain 10 is provided at the edge of the substrate W to remove any liquid which enters the gap 5. In the embodiment of FIG. 6, only one drain 10 is illustrated though there may only be two or there could be more than two drains. The drain 10 is, for example, annular so that the whole periphery of the substrate W is surrounded.

A function of the drain 10 is to prevent bubbles of gas from entering the liquid 11 of the liquid supply system 12. Any such bubbles can deleteriously affect the imaging of the substrate W. A further drain may be provided to prevent any liquid, which finds its way from the gap 5 to underneath the substrate W, from harming efficient release of the substrate W from the substrate table WT after imaging. As is conventional, the substrate W is held by a pimple table 30 comprising a plurality of projections 32. An underpressure applied between the substrate W and the substrate table WT by the pimple table 30 ensures that the substrate W is held firmly in place. However, if liquid gets between the substrate W and the pimple table 30, this can lead to difficulties, particularly when unloading the substrate W. The provision of a second drain under the pimple table 30 reduces or eliminates problems which may occur due to liquid finding its way underneath the substrate W.

The drain 10 removes liquid by way of an underpressure. That is, the drain is connected via outlet 142 to an underpressure source. This underpressure source effectively removes any liquid which enters the drain. The underpressure source is effective to draw gas in from outside of the gap 5 above the substrate table WT through the drain and out through the outlet. Measures may be taken only to connect the outlet 142 to the underpressure source when there is a chance of liquid entering the gap 5.

A difficulty with arrangement is that the gap 5, an inlet to the drain 10, a gap between the drain inlet and the substrate and/or the area underneath an outer portion of the substrate W can collect contaminants such as particles. A contaminant deposited there may easily be washed out and back onto the surface of the substrate W or underneath the edge of the substrate or onto the top surface of the substrate table or into the immersion liquid. Such a contaminant may cause imaging defects as a result. The contaminant may be soluble or insoluble in liquid (e.g., water). For example, the contaminant may be top coat, resist, a residual particle on the top of the substrate or substrate table top surface, etc. One way to deal with this problem is to increase the flow of liquid through the drain 10. This can be achieved, for example, by increasing the underpressure applied to the outlet 142. However, this is not necessarily desirable because of the increased heat load applied to the substrate table as a result of increased flow through the drain 10.

In an embodiment, a system of cleaning the gap 5 is disclosed which is particularly effective. The system does not wash dirt back onto the substrate W or substrate table WT. Furthermore, the system optionally does not require the removal of the substrate table from the lithographic apparatus.

In each embodiment described herein a drain is present. The drain is in the substrate table. The drain 10 is configured to receive an immersion fluid which leaks, in use, between an edge of an object on the substrate table and the substrate table. The lithographic apparatus comprises a cleaning fluid supply device 14 configured to supply cleaning fluid to the drain. Thus, the lithographic apparatus itself can supply cleaning fluid directly into the drain. Embodiments of the invention may apply to other embodiments of a drain.

Any fluid can be used as the cleaning fluid. In an embodiment, the cleaning fluid is different to the immersion fluid. The cleaning fluid may comprise ultra pure water. The cleaning fluid may comprise ultra pure water combined with an additive. An additive may be a surfactant or a solvent for the expected type of particle or a detergent or a liquefied gas, such as carbon dioxide, or a dissolved gas, such as oxygen, ozone or nitrogen, or a non-polar organic solvent or a polar organic solvent. A solvent can be cyclic (e.g., cyclohexane, benzene, etc.) or aliphatic (ethanol, acetone, isopropylalcohol, etc.) or a combination thereof. One of the differences in behavior is their polarity (cyclic=apolar, aliphatic=polar) which can be used to dissolve/remove different kinds of contamination. A cleaning agent can be water-based or solvent-based, and may be acidic, alkaline (e.g., addition of HCl or $NH_3$ to water respectively, and/or an industrial cleaning agent) or neutral. The expected type of contamination can influence the choice for a certain system. Alternatively or additionally, the above-mentioned additives may be used as a pure liquid. Apart from a solvent and/or a surfactant, certain cleaning agents may be used, which can be acidic or alkaline, depending on the type of particles/contamination that needs to be removed. A cleaning agent may be a combination of a liquid (water or solvent) and a surfactant, and possibly one or more other additives. An embodiment of the invention can be used with any sort of cleaning fluid. The ultra pure water may contain at least one component selected from the following components: ozone, hydrogen peroxide or oxygen.

The cleaning fluid supply device can comprise a cleaning fluid inlet in the drain. Alternatively or additionally, the cleaning fluid inlet may be moveable relative to the substrate table.

In an embodiment, the cleaning fluid inlet is positioned (in use) such that flow of cleaning fluid from the inlet into the drain is at least partly radially outwardly. This helps in directing any debris towards the outlet of the drain away from the substrate and the top surface of the substrate table.

In an embodiment, the cleaning fluid inlet may be part of a liquid confinement system (such as that illustrated in FIG. 5). The inlet may be within the liquid confinement system, or it may be located on a separate body associated with or attached to the liquid confinement system; it may even be a separate component. The liquid confinement system at least partly confines immersion liquid to a space between a projection system and the substrate during imaging.

The cleaning fluid inlet may be part of the substrate table. Alternatively or additionally, the cleaning fluid inlet may be formed adjacent an end of an elongate member. For example, the cleaning fluid inlet may be in the form of a needle. The needle facilitates access to the gap.

In an embodiment, a controller may be provided to control cleaning. The controller can control the underpressure applied to the drain and/or flow rate of cleaning fluid out of the cleaning fluid supply device. In this way the removal of cleaning fluid from the drain can be controlled. The controller may control one or more actuators to change the relative position of a cleaning fluid inlet and the drain. In this way the cleaning fluid can be supplied to all or some parts of the drain. The controller may ensure that a continuous flow of cleaning fluid into the drain is present, for example by controlling a valve or a flow restriction. This may ensure that the heat load applied to the substrate table is constant at all times.

The lithographic apparatus may comprise an extraction outlet configured to extract cleaning fluid out of the drain. In this way the cleaning fluid does not need to pass through the outlet of the drain. The extraction outlet may be formed adjacent an end of an elongate member. For example the extraction outlet may be in the form of an extraction needle. In an embodiment, the extraction outlet may be located in the substrate table.

The lithographic apparatus may comprise a reservoir of cleaning fluid to which the cleaning fluid supply device is attached.

The construction details of the drain will be described in detail below. However, it should be understood that the principles herein can be applied to any type of drain in an immersion apparatus which by virtue of use of the apparatus can be contaminated. It will also be appreciated that the structures to provide cleaning fluid to the drain 10 may be provided at any location, for example, so long as the cleaning function is met and as long as there are no deleterious interactions with other components of the apparatus. It should be noted that the arrangement herein described may be adopted for a dry lithographic apparatus where defectivity is a problem.

In drain 10, a channel 110 leads from the gap 5 between the substrate W and the substrate table WT into a first chamber 120. Both the channel 110 and the chamber 120 are, for example, annular. The channel 110 is desirably in the form of a slit. That is, it is relatively narrow compared to its height. It may extend in any direction. A second chamber 140 is in fluid communication with the first chamber 120 through a plurality of through holes 130. The through holes 130 are spaced around the periphery of the substrate, desirably evenly. The outlet 142, which is connected to an underpressure source, is in communication with the bottom of the second chamber 140. As will be appreciated, the shape of the chambers 120, 140 can vary in cross-section from those illustrated in FIG. 6 and reference is made to the disclosures in Japanese patent application publication JP 2007-072118 and U.S. patent application Ser. No. 11/390,427, filed Mar. 28, 2006, for various cross-sectional shapes which work and for details regarding the surface properties of the various faces of the chambers which might be desirable.

A cleaning fluid (e.g., liquid) inlet 122 is provided adjacent or in the gap 5. The inlet 122 may provide a spray of fluid, as illustrated, or can provide a continuous flow of fluid or anything in between (e.g. a constant drip of droplets). The cleaning fluid is provided in a reservoir 150 which is connected by a conduit to the inlet 122. The reservoir 150 may be in the substrate table or remote from the substrate table WT and connected to the substrate table WT with a conduit that may be flexible.

The position of the inlet 122 is such that when the underpressure applied to outlet 142 is activated the cleaning fluid exiting the inlet 122 will move radially outwardly and down into the chamber 120. In this way the chance of cleaning fluid and debris contained or dissolved in the cleaning fluid reaching the substrate W or the top surface of the substrate table WT, is reduced.

The inlet 122 could be a continuous or discontinuous groove around the entire periphery of the drain 10. The periphery of the drain may be circumferential. The inlet 122 illustrated in FIG. 6 may be one of several discrete cleaning fluid inlets which are positioned around the periphery of the drain 10. In an embodiment, enough inlets 122 are provided so that all areas of the drain 10 can be reached with cleaning fluid.

Cleaning may take place at any time. Cleaning is desirably carried out while the substrate table is in the lithographic apparatus. Cleaning can be carried out with a substrate W in place on the pimple table 30. The cleaning may even be carried out when the substrate W is not present on the pimple table 30. Cleaning may be carried out during imaging of the substrate. Cleaning may be carried out at times other than the imaging time of the substrate. For example, cleaning may be carried out while the substrate W is being moved from under the projection system during substrate swap, during metrology measurement or at any other time.

In an embodiment, the cleaning fluid is a solvent. The cleaning fluid is such that dirt and particles which would otherwise remain in the gap 5 and/or under an edge portion of the substrate W, are washed away. The action of the cleaning fluid may be to dissolve or partially dissolve contaminant particles. Alternatively or additionally, the action of the cleaning fluid may help to detach contaminant particles from surfaces. The cleaning fluid may be ultra pure water with at least one component selected from the following components: ozone, hydrogen peroxide or oxygen. A solvent which removes a coating from immersion system components or dissolves glue or other parts of the substrate table WT and other components of the immersion system should be avoided. The cleaning fluid may comprise ultra pure water with one or more components selected from the following components: a surfactant or a solvent for the expected type of particle or a detergent or a liquefied gas, such as carbon dioxide, or a dissolved gas, such as oxygen, ozone or nitrogen, or a non-polar organic solvent or a polar organic solvent. A solvent can be cyclic (e.g., cyclohexane, benzene, etc.) or aliphatic (ethanol, acetone, isopropylalcohol, etc.) or a combination thereof. One of the differences in behavior is their polarity (cyclic=apolar, aliphatic=polar) which can be used to dissolve/remove different kinds of contamination. A cleaning agent can be water-based or solvent-based, and may be acidic, alkaline (e.g., addition of HCl or $NH_3$ to water respectively, and/or an industrial cleaning agent) or neutral. The expected type of contamination can influence the choice for a certain system. The above mentioned additives may be used as a pure liquid. Apart from solvents and surfactants, certain cleaning agents may be used, which can be acidic or alkaline, depending on the type of particles/contamination that needs to be removed. A cleaning agent may be a combination of a liquid (water or solvent) and a surfactant, and possibly one or more other additives. An embodiment of the invention can be used with any sort of cleaning fluid. The ultra pure water may contain at least one component selected from the following components: ozone, hydrogen peroxide or oxygen.

It may be advantageous to maintain the cleaning flow of fluid out of inlet 122 over time. This can help in maintaining a constant heat load on the substrate table WT. If the space 11 is not above the gap 5, liquid will not be entering the drain 10 (at least in the part of the drain which is not below the space 11). Therefore, in those areas, it may be advantageous to provide a cleaning flow of fluid through inlet 122. In this way there is a continuous flow of fluid through the drain 10 over time thereby resulting in a constant heat load. Thus, it may be seen that the cleaning liquid supply device is configured to actively supply a second liquid to the drain independent of the position of the substrate table WT. A controller (not illustrated) is provided for this purpose as well as for the purpose of controlling the apparatus to operate as described above.

In this embodiment, the supply to the inlet 122 from the reservoir 150 is a valved supply controlled by a valve 155. The valve may be operable by the controller.

Figure 7:
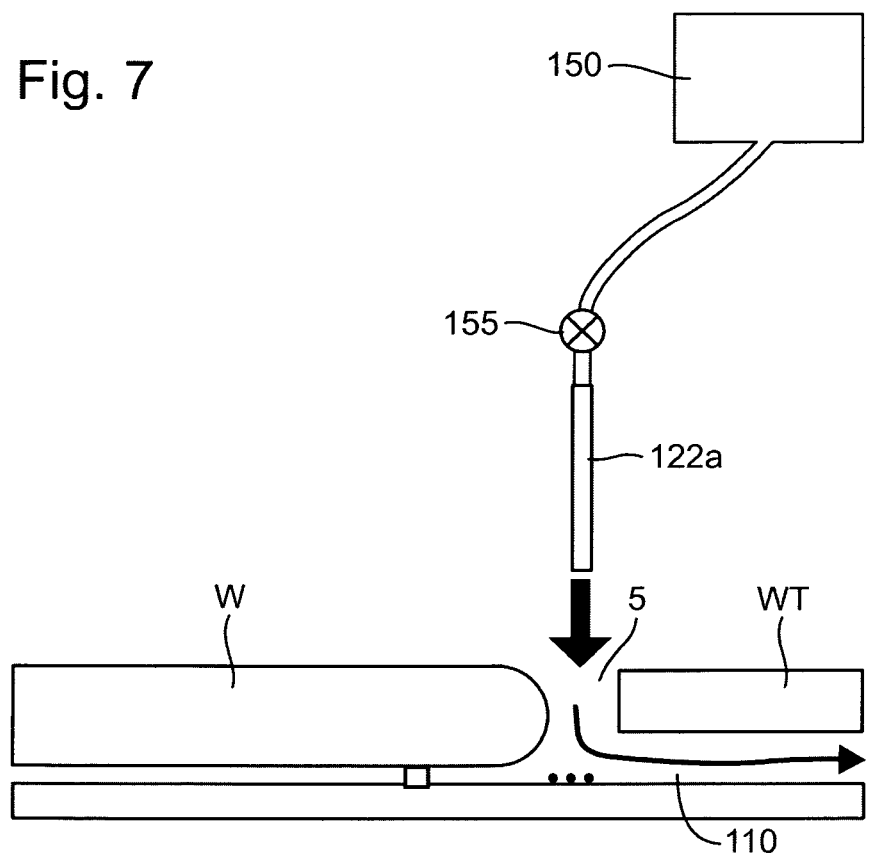
FIG. 7 illustrates, in cross-section, a substrate table according to an embodiment of the invention.

FIG. 7 illustrates schematically an embodiment which is the same as the embodiment as described above with respect to FIG. 6 except as described below. In this embodiment, the cleaning fluid inlet is provided separate from the substrate table WT. The cleaning fluid inlet 122*a* is provided in an end of an elongate body. The elongate body can be seen as a needle with an outlet in its end. In this way cleaning fluid can be more easily directed.

The inlet 122*a* is connected to a cleaning fluid reservoir 150 via a valve 155. A plurality of inlets 122*a* may be provided or only one inlet 122*a* may be provided.

The inlet 122*a* may be fixed relative to the projection system PS or may be moveable relative to the projection system PS. In either case relative movement of the inlet 122*a* to the substrate table WT is possible. An actuator may move the inlet 122*a* into position. A controller may operate the actuator. In use the inlet 122*a* may be positioned in or near the gap 5 between the substrate W (or the place where the substrate would be if it were present) and the substrate table. In this way cleaning fluid can be directed at all parts of the drain 10 accessible through the gap 5 and/or surface of the substrate and substrate table located under the edge portion of the substrate that is accessible through the gap 5.

As can be seen, the drain 10 has different geometry in this embodiment. This does not affect the invention. It does illustrate however that the invention may be applicable to any type of gap 5 or drain 10 between an object positioned on the substrate table and the substrate table itself.

In an embodiment, the inlet 122*a* can be provided on the liquid confinement system used to at least partly confine liquid to a space between the final element of the projection system and the substrate. For example the inlet 122*a* could be attached to the barrier member 12 of FIG. 5. In an embodiment, the inlet 122*a* could be comprised within the barrier member 12. In an embodiment, the inlet 122*a* could be a separate component.

The cleaning fluid from inlet 122*a* can be directed such that it moves radially outwardly in the drain. This radially outwardly motion can be achieved by applying underpressure to the drain. The apparatus of FIG. 7 can be used with the substrate in position or the substrate not in position.

This embodiment has an advantage that no extra space is taken up on the substrate table which is already quite crowded. Desirably a low extraction flow rate is used, particularly for flushing out soluble particles. A high flow rate may be more appropriate for non-soluble particles. This embodiment is also or alternatively advantageous in that the flow of liquid out of the inlet 122*a* is in a direction away from the top surfaces of the substrate W and substrate table WT.

Figure 8:
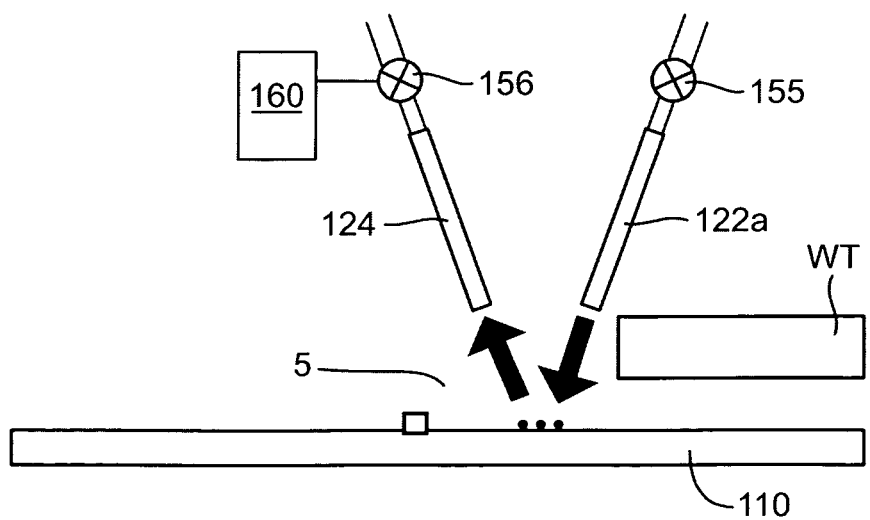
FIG. 8 illustrates, in cross-section, a substrate table according to an embodiment of the invention.

FIG. 8 illustrates schematically an embodiment which is the same as the embodiment as described above with respect to FIG. 7 except as described below. As can be seen from FIG. 8, an inlet 122*a*, a valve 155 and a reservoir (not illustrated in FIG. 8) as in FIG. 7 is provided. Further, an extraction outlet 124 is provided. The extraction outlet 124 is different to the outlet of the drain in the substrate table. The extraction outlet 124 can be of the same construction as the inlet 122*a* and can be positioned either radially inwardly of the inlet 122*a* (as illustrated) or can be positioned radially outwardly of the inlet 122*a* or at the same radial location. The outlet 124 can be moveable relative to the substrate table WT. For example, the outlet 124 can be moved by an actuator (not illustrated) under the control of the controller. An underpressure is applied to the extraction outlet 124 and cleaning fluid provided by the inlet 122*a* and any dirt is extracted through the extraction outlet 124. A valve 156 and controller 160 combination operates a valve of the extraction outlet 124 to control the extraction flow. The controller 160 may be the same or different to the controller controlling valve 155. The outlet is in the end of an elongate body. The outlet can be seen as being in the form of a needle. As will be appreciated, this set up can be used on a gap or a drain from which no extraction usually occurs. That is, there is no equivalent to extraction outlet 142 of FIG. 6. Therefore, because there is no need for the drain, this embodiment could be used for cleaning the edge of a recess in which a substrate sits in a non-immersion (i.e. dry) lithographic apparatus.

As in the other embodiments, the controller helps to ensure that supply by the inlet 122*a* and extraction by the extraction outlet 124 occur when the inlet 122*a* (and outlet 124) are in position to supply cleaning fluid to the gap 5 (and extracting fluid). The controller also controls the flow into and out of the inlet 122*a* and outlet 124.

As illustrated, in this embodiment, it is desirable that cleaning takes place in the absence of the substrate W. However, this need not be the case. The inlets 122*a* and/or outlet 124 may be attached to a liquid confinement system, but in an embodiment located outside of the liquid confinement system.

Although various embodiments have been described, any combination of features from the embodiments is possible. For example, the embodiment described with respect to FIG. 6 may be provided with the extraction outlet 124 of the embodiment described with respect to FIG. 8 and the cleaning fluid may then not be extracted through the drain 10.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of one or more computer programs containing one or more sequences of machine-readable instructions describing a method as disclosed above, or one or more data storage medium (e.g. semiconductor memory, magnetic or optical disk) having such one or more computer program stored therein. At least one controller may be provided to control the apparatus. One or more different controllers referred to herein may be operable when the one or more computer programs are read by one or more computer processors located within at least one component of the lithographic apparatus. One or more processors are configured to communicate with the at least one of the controllers; thereby the controller(s) operate according the machine readable instructions of one or more computer programs. Each controller may operate at least a component of the apparatus according to the one or more of the computer programs embodying the invention.

One or more embodiments of the invention may be applied to any immersion lithography apparatus, in particular, but not exclusively, those types mentioned above and whether the immersion liquid is provided in the form of a bath, only on a localized surface area of the substrate, or is unconfined. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion fluid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid. The one or more controlling elements can be provided to control the apparatus. The controller may have a processor which may operate to execute the one or more computer programs.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used, although they should be considered more generically. It is intended that such terms should also extend to other high refractive index liquids which may be used, such as fluorine containing hydrocarbons.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising;
a substrate table constructed to hold a substrate;
a recess in the substrate table configured to receive the substrate;
a cleaning fluid device configured to supply cleaning fluid to at least an outer area of the recess and to substantially below a top surface of the substrate table using a cleaning fluid inlet into the recess, the cleaning fluid inlet being part of the substrate table and positioned in the recess, wherein a position of the cleaning fluid inlet is such that flow of cleaning fluid from the inlet is at least partly radially outwardly relative to a center of the substrate and wherein the cleaning fluid comprises a liquid; and
a drain, separate from the inlet, in the substrate table to receive the cleaning fluid.

2. The lithographic apparatus of claim 1, further comprising a reservoir of cleaning fluid.

3. The lithographic apparatus of claim 1, wherein the cleaning fluid inlet is formed adjacent an end of an elongate member.

4. The lithographic apparatus of claim 3, wherein the elongate member is a needle.

5. The lithographic apparatus of claim 1, further comprising a controller configured to activate an underpressure source in the drain to remove cleaning fluid from the drain.

6. The lithographic apparatus of claim 1, wherein the apparatus is an immersion lithographic apparatus, the cleaning fluid is different from the immersion fluid, and the drain in the substrate table receives immersion liquid which leaks, in use, past an edge of the substrate into the recess.

7. The lithographic apparatus of claim 6, wherein the drain is in the outer area of the recess.

8. The lithographic apparatus of claim 6, further comprising a controller configured to ensure that a continuous flow of cleaning fluid into the drain is present.

9. The lithographic apparatus of claim 1, wherein the cleaning fluid device is configured to provide a cleaning fluid comprising ultra pure water and at least one component selected from the following components: a surfactant, a solvent, a detergent, a liquefied gas, a dissolved gas, a non-polar organic solvent or a polar organic solvent.

10. The lithographic apparatus of claim 9, wherein the component is liquefied gas and the liquefied gas comprises carbon dioxide.

11. The lithographic apparatus of claim 9, wherein the component is dissolved gas and the dissolved gas comprises oxygen, or ozone, or hydrogen peroxide, or nitrogen, or any combination thereof.

12. The lithographic apparatus of claim 1, further comprising an extraction outlet which is a separate outlet to an outlet of the drain.

13. The lithographic apparatus of claim 12, wherein the extraction outlet is formed adjacent an end of an elongate member.

14. The lithographic apparatus of claim 12, wherein the extraction outlet is moveable relative to the substrate table and/or is part of a liquid confinement system configured to at least partly confine immersion liquid between a projection system and the substrate table.

15. An immersion lithographic apparatus comprising:
a substrate table constructed to hold a substrate;
a drain in the substrate table configured to receive an immersion fluid which leaks, in use, into a gap between an edge of the substrate table and the substrate when on the substrate table; and
an inlet adjacent an end of an elongate member configured to supply cleaning fluid to (i) the gap, or (ii) an inlet to the drain, or (iii) the drain, or (iv) any combination selected from (i)-(iii), the inlet positioned or positionable below or in the gap and the apparatus configured to provide the cleaning fluid from the inlet substantially below a top surface of the substrate table, wherein the inlet is positioned or positionable such that flow of cleaning fluid from the inlet into the drain is at least partly radially outwardly relative to a center of the substrate and wherein the cleaning fluid is different from the immersion fluid and comprises a liquid.

16. The immersion lithographic apparatus of claim 15, wherein the inlet is in the form of a needle.

17. The immersion lithographic apparatus of claim 15, further comprising an extraction outlet which is a separate outlet to an outlet of the drain.

18. The lithographic apparatus of claim 17, wherein the extraction outlet is formed adjacent an end of an elongate member.

19. The lithographic apparatus of claim 15, wherein the liquid supply system is configured to provide a cleaning fluid which is comprised of ultra pure water and at least one component selected from the following components: a liquefied gas, a dissolved gas, a non-polar organic solvent or a polar organic solvent.

20. The lithographic apparatus of claim 15, further comprising a controller configured to ensure that a continuous flow of cleaning fluid into the drain is present.

21. A method of cleaning at least a part of a recess in a table configured to receive a radiation-sensitive substrate, the method comprising:
providing a cleaning fluid to at least an outer area of the recess to receive the radiation-sensitive substrate and substantially below a top surface of the table using a cleaning fluid inlet into the recess such that flow of cleaning fluid from the inlet is at least partly radially outwardly relative to a center of the substrate, the cleaning fluid inlet being part of the table and positioned in the recess and the cleaning fluid comprising a liquid; and
extracting the cleaning fluid from the recess into a drain of the table, the drain being separate from the inlet.

22. The method of claim 21, wherein the method is performed when the substrate is present in the recess on the table.

23. The method of claim 21, wherein the method is performed when the substrate is not on the table.

24. The method of claim 21, wherein the table is a table for an immersion lithographic apparatus and the drain receives immersion liquid which leaks, in use, past an edge of the substrate into the recess.

25. The method of claim 24, wherein the cleaning fluid is different from the immersion liquid.

26. The method of claim 21, wherein the method is performed within an immersion lithographic apparatus.

27. The method of claim 21, further comprising activating an underpressure source in a drain to remove the cleaning fluid from the drain.

28. The method of claim 21, wherein the cleaning fluid comprises ultra pure water and at least one component selected from the following components: a surfactant, a solvent, a detergent, a liquefied gas, a dissolved gas, a non-polar organic solvent or a polar organic solvent.

29. A lithographic projection apparatus comprising:
a projection system arranged to project a pattern towards a table;
a liquid supply system arranged to supply a cleaning fluid to a gap defined between an edge of the table and a radiation-sensitive substrate when present on the table, the liquid supply system having an inlet positioned or positionable in the gap to supply the cleaning fluid to the gap and to substantially below a top surface of the table, wherein the inlet is positioned or positionable such that flow of cleaning fluid from the inlet is at least partly radially outwardly relative to a center of the substrate and wherein the cleaning fluid comprises a liquid; and
an outlet configured to remove excess fluid, wherein in use the outlet is located in the gap and is connected to an under pressure source so as to remove liquid from the gap.

30. The lithographic apparatus of claim 29, wherein the cleaning fluid inlet is formed adjacent an end of a needle.

31. The lithographic apparatus of claim 29, wherein the apparatus is an immersion lithographic apparatus and wherein the outlet comprises a drain in the table to receive immersion liquid which leaks, in use, past an edge of the substrate into the gap.

32. The lithographic apparatus of claim 31, further comprising a controller configured to ensure that a continuous flow of cleaning fluid into the drain is present.

33. The lithographic apparatus of claim 29, wherein the liquid supply system is configured to provide a cleaning fluid which is comprised of ultra pure water and at least one component selected from the following components: a liquefied gas, a dissolved gas, a non-polar organic solvent or a polar organic solvent.

* * * * *